US 9,042,159 B2

(12) United States Patent
Sutardja et al.

(10) Patent No.: US 9,042,159 B2
(45) Date of Patent: May 26, 2015

(54) CONFIGURING RESISTIVE RANDOM ACCESS MEMORY (RRAM) ARRAY FOR WRITE OPERATIONS

(71) Applicant: Marvell World Trade Ltd., St. Michael (BB)

(72) Inventors: Pantas Sutardja, Los Gatos, CA (US); Albert Wu, Palo Alto, CA (US); Runzi Chang, San Jose, CA (US); Winston Lee, Palo Alto, CA (US); Peter Lee, Pleasanton, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days.

(21) Appl. No.: 14/050,696

(22) Filed: Oct. 10, 2013

(65) Prior Publication Data
US 2014/0104927 A1    Apr. 17, 2014

Related U.S. Application Data

(60) Provisional application No. 61/713,986, filed on Oct. 15, 2012.

(51) Int. Cl.
G11C 13/00    (2006.01)

(52) U.S. Cl.
CPC ........ *G11C 13/0069* (2013.01); *G11C 13/0002* (2013.01); *G11C 13/0007* (2013.01); *G11C 2013/0073* (2013.01); *G11C 2213/79* (2013.01); *G11C 2213/82* (2013.01)

(58) Field of Classification Search
CPC ........... G11C 13/0069; G11C 13/0002; G11C 13/0007; G11C 2013/0073; G11C 2213/79; G11C 2213/82; G11V 13/0004
USPC ................................ 365/148, 100, 158, 163
See application file for complete search history.

(56) References Cited

U.S. PATENT DOCUMENTS 5,392,235 A    2/1995    Nishitani et al.
5,706,226 A    1/1998    Chan et al.
(Continued)

FOREIGN PATENT DOCUMENTS

EP    0011448 A1    5/1980
EP    1426975 A2    6/2004
(Continued)

OTHER PUBLICATIONS

International Search Report for PCT Application No. 2013/064811 mailed Dec. 6, 2013; 3 Pages.
(Continued)

*Primary Examiner* — Tan T. Nguyen

(57) ABSTRACT

A system includes a resistive random access memory cell and a driver circuit. The resistive random access memory cell includes a resistive element and a switching element, and has a first terminal connected to a bit line and a second terminal connected to a word line. The driver circuit is configured to apply, in response to selection of the resistive random access memory cell using the word line, a first voltage of a first polarity to the bit line to program the resistive random access memory cell to a first state by causing current to flow through the resistive element in a first direction, and a second voltage of a second polarity to the bit line to program the resistive random access memory cell to a second state by causing current to flow through the resistive element in a second direction.

22 Claims, 6 Drawing Sheets

(56) References Cited

U.S. PATENT DOCUMENTS

| | | |
|---|---|---|
| 6,671,197 B2 | 12/2003 | Athanassiadis |
| 7,495,944 B2 | 2/2009 | Parkinson et al. |
| 7,499,349 B2 | 3/2009 | Roehr |
| 7,570,524 B2 | 8/2009 | Bedeschi et al. |
| 7,835,171 B2 | 11/2010 | Ono et al. |
| 7,903,448 B2 * | 3/2011 | Oh et al. ............... 365/148 |
| 8,059,448 B2 * | 11/2011 | Tanigami et al. ........ 365/148 |
| 8,064,241 B2 | 11/2011 | Morita et al. |
| 8,760,927 B2 | 6/2014 | Deng |
| 8,817,528 B2 | 8/2014 | Otto et al. |
| 8,885,388 B2 | 11/2014 | Sutardja et al. |
| 2004/0252548 A1 | 12/2004 | Tsukamoto et al. |
| 2008/0310221 A1 | 12/2008 | Baker |
| 2009/0243652 A1 | 10/2009 | Dorairaj et al. |
| 2009/0303785 A1 | 12/2009 | Hwang et al. |
| 2010/0097844 A1 | 4/2010 | Liu |
| 2010/0110762 A1 * | 5/2010 | Chen et al. ............ 365/148 |
| 2010/0142245 A1 | 6/2010 | Kitagawa |
| 2010/0157706 A1 | 6/2010 | Cho et al. |
| 2010/0259968 A1 * | 10/2010 | Tsushima et al. ........ 365/148 |
| 2010/0296334 A1 | 11/2010 | Houston et al. |
| 2010/0296336 A1 | 11/2010 | Houston |
| 2011/0007553 A1 | 1/2011 | Takagi et al. |
| 2011/0051499 A1 | 3/2011 | Hamilton |
| 2011/0228599 A1 * | 9/2011 | Tian et al. ............. 365/163 |
| 2012/0014171 A1 | 1/2012 | Chuang et al. |
| 2012/0063196 A1 | 3/2012 | Kim et al. |
| 2012/0087175 A1 * | 4/2012 | Zhu et al. ............... 365/148 |
| 2012/0140552 A1 | 6/2012 | Seikh et al. |
| 2012/0155151 A1 | 6/2012 | Rachamadugu et al. |
| 2014/0003126 A1 * | 1/2014 | Huang ................... 365/148 |
| 2014/0104926 A1 | 4/2014 | Sutardja et al. |
| 2014/0104927 A1 | 4/2014 | Sutardja et al. |
| 2014/0112057 A1 | 4/2014 | Sutardja et al. |
| 2014/0119103 A1 | 5/2014 | Lee et al. |
| 2014/0133217 A1 | 5/2014 | Lee et al. |

FOREIGN PATENT DOCUMENTS

| | | |
|---|---|---|
| EP | 2063467 A1 | 5/2009 |
| WO | WO-2007138646 A1 | 12/2007 |
| WO | WO-2009013819 A1 | 1/2009 |

OTHER PUBLICATIONS

Notification of Transmittal of the International Search Report and the Written Opinion of the International Searching Authority, or the Declaration dated Feb. 3, 2014 in reference to PCT/US2013/067454 (13 pgs).

Xu Wang et al: "A nove 1 1 ow power 64-kb SRAM using bit-lines charge-recycling and non-uniform cell scheme", Electronics, Circuits and Systems (ICECS), 2011 18th IEEE International Conference on, IEEE, Dec. 11, 2011, pp. 528-531.

U.S. Appl. No. 14/050,678, Pantas Sutardja.
U.S. Appl. No. 14/059,790, Pantas Saturdja et al.
U.S. Appl. No. 14/066,796, Winston Lee et al.
U.S. Appl. No. 14/066,817, Pantas Sutardja.

Synopsys Insight Newsletter; FinFET: The Promises and the Challenges; Issue 3, 2012; 5 pages.

International Search Report for PCT/US2013/064819 dated Feb. 11, 2014; 7 Pages.

International Search Report for related PCT Application No. PCT/US2013/066303; May 16, 2014; 6 pages.

International Search Report for related PCT Application No. PCT/US2013/067441; Jan. 23, 2014; 7 pages.

* cited by examiner

CONFIGURING RESISTIVE RANDOM ACCESS MEMORY (RRAM) ARRAY FOR WRITE OPERATIONS

CROSS-REFERENCE TO RELATED APPLICATIONS

This application claims the benefit of U.S. Provisional Application No. 61/713,986, filed on Oct. 15, 2012. The entire disclosure of the application referenced above is incorporated herein by reference.

FIELD

The present disclosure relates to systems and methods for configuring resistive random access memory (RRAM) array for write operations.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A resistive random access memory (RRAM) array includes RRAM cells arranged at intersections of word lines and bit lines. A RRAM cell includes an insulating material as a resistive element. The resistance of the insulating material increases when current is passed through the insulating material in one direction and decreases when current is passed through the insulating material in an opposite direction. Accordingly, the RRAM cell can be programmed to a high resistance state by passing current through the RRAM cell in one direction and a low resistance state by passing current through the RRAM cell in an opposite direction. The high resistance state can be used to denote logic high (binary 1), and the low resistance state can be used to denote logic low (binary 0), or vice versa.

RRAM cells that are programmed to high and low resistance states using currents of opposite polarities are called bipolar RRAM cells. Alternatively, RRAM cells can be programmed to high and low resistance states by passing currents of two different magnitudes in the same direction through the insulating material of the RRAM cells. RRAM cells that are programmed to high and low resistance states using currents of two different magnitudes in the same direction are called unipolar RRAM cells.

Each RRAM cell includes a switching element such as a diode or a transistor. The switching element is connected in series with the insulating material (i.e., the resistive element). Using the switching element, the RRAM cells in the RRAM array can be selected and deselected during read and write operations.

SUMMARY

A system comprises a resistive random access memory cell and a driver circuit. The resistive random access memory cell includes (i) a resistive element and (ii) a switching element. The resistive random access memory cell has (i) a first terminal and (ii) a second terminal. The first terminal is connected to a bit line. The second terminal is connected to a word line. The driver circuit is configured to apply, in response to selection of the resistive random access memory cell using the word line, a first voltage of a first polarity to the bit line to program the resistive random access memory cell to a first state by causing current to flow through the resistive element in a first direction, and a second voltage of a second polarity to the bit line to program the resistive random access memory cell to a second state by causing current to flow through the resistive element in a second direction.

In another feature, the resistive random access memory cell has a third terminal, and the third terminal is connected to a reference potential.

In other features, the second polarity is opposite to the first polarity, and the second direction is opposite to the first direction.

In another feature, the resistive element is connected to the switching element in series.

In other features, the resistive random access memory cell has a third terminal connected to a reference potential. The resistive element has (i) a first terminal and (ii) a second terminal. The first terminal of the resistive element is connected to the first terminal of the resistive random access memory cell. The switching element has (i) a first terminal, (ii) a second terminal, and (iii) a control terminal. The first terminal of the switching element is connected to the second terminal of the resistive element. The second terminal of the switching element is connected to the third terminal of the resistive random access memory cell. The control terminal of the switching element is connected to the second terminal of the resistive random access memory cell.

In other features, the resistive random access memory cell has a third terminal connected to a reference potential. The resistive element has (i) a first terminal and (ii) a second terminal. The first terminal of the resistive element is connected to the third terminal of the resistive random access memory cell. The switching element has (i) a first terminal, (ii) a second terminal, and (iii) a control terminal. The first terminal of the switching element is connected to the second terminal of the resistive element. The second terminal of the switching element is connected to the first terminal of the resistive random access memory cell. The control terminal of the switching element is connected to the second terminal of the resistive random access memory cell.

In other features, the switching element includes a metal-oxide semiconductor field-effect transistor, and a substrate of the metal-oxide semiconductor field-effect transistor is connected to a reference potential of the resistive random access memory cell.

In other features, the switching element includes a metal-oxide semiconductor field-effect transistor, and the system further comprises a charge pump configured to charge a substrate of the metal-oxide semiconductor field-effect transistor to a third voltage of the second polarity in response to driver circuit applying the voltage of the second polarity to the bit line. The third voltage prevents a PN junction between (i) the substrate and (ii) the first terminal or the second terminal of the metal-oxide semiconductor field-effect transistor from being forward biased in response to driver circuit applying the voltage of the second polarity to the bit line.

In still other features, a system comprises a first resistive random access memory, a second resistive random access memory, and a driver circuit. The first resistive random access memory cell is arranged along a first bit line. The first resistive random access memory cell includes (i) a first resistive element and (ii) a first switching element. The first resistive random access memory cell has (i) a first terminal, (ii) a second terminal, and (iii) a third terminal. The first terminal is connected to a first bit line. The second terminal is connected to a first word line. The third terminal is connected to a second word line. The second resistive random access memory cell is arranged along a second bit line. The second resistive random access memory cell includes (i) a second resistive element and (ii) a second switching element. The second resistive random access memory cell has (i) a first terminal, (ii) a second terminal, and (iii) a third terminal. The first terminal of the second resistive random access memory cell is connected to a second bit line. The second terminal of the second resistive random access memory cell is connected to the first word line. The third terminal of the second resistive random access memory cell is connected to the second word line. The driver circuit is configured to apply voltages to (i) the first word line, (ii) the second word line, (iii) the first bit line, and (iv) the second bit line; program the first resistive random access memory cell to a first state by causing current to flow through the first resistive element in a first direction; and program the second resistive random access memory cell to a second state by causing current to flow through the second resistive element in a second direction.

In other features, the driver circuit is configured to apply a supply voltage to (i) the first word line and (ii) the first bit line, apply one-half of the supply voltage to the second word line, and apply a reference potential to the second bit line.

In other features, the driver circuit is configured to apply a supply voltage to the first word line; (i) apply a reference potential to the second word line, (ii) apply the supply voltage to the first bit line, and (iii) apply the reference potential to the second bit line or float the second bit line; and (i) apply the supply voltage to the second word line, (ii) apply the supply voltage to the first bit line or float the first bit line, and (iii) apply the reference potential to the second bit line.

In other features, the first resistive element has (i) a first terminal and (ii) a second terminal. The first terminal of the first resistive element is connected to the first terminal of the first resistive random access memory cell. The first switching element has (i) a first terminal, (ii) a second terminal, and (iii) a control terminal. The first terminal of the first switching element is connected to the second terminal of the first resistive element. The second terminal of the first switching element is connected to the third terminal of the first resistive random access memory cell. The control terminal of the first switching element is connected to the second terminal of the first resistive random access memory cell.

In other features, the second resistive element has (i) a first terminal and (ii) a second terminal. The first terminal of the second resistive element is connected to the first terminal of the second resistive random access memory cell. The second switching element has (i) a first terminal, (ii) a second terminal, and (iii) a control terminal. The first terminal of the second switching element is connected to the second terminal of the second resistive element. The second terminal of the second switching element is connected to the third terminal of the second resistive random access memory cell. The control terminal of the second switching element is connected to the second terminal of the second resistive random access memory cell.

In still other features, a method comprises selecting, using a word line, a resistive random access memory cell. The resistive random access memory cell includes (i) a resistive element and (ii) a switching element. The resistive random access memory cell has (i) a first terminal and (ii) a second terminal. The first terminal is connected to a bit line. The second terminal is connected to the word line. The method further comprises applying, in response to selection of the resistive random access memory cell using the word line, a first voltage of a first polarity to the bit line to program the resistive random access memory cell to a first state by causing current to flow through the resistive element in a first direction, and a second voltage of a second polarity to the bit line to program the resistive random access memory cell to a second state by causing current to flow through the resistive element in a second direction.

In other features, the resistive random access memory cell has a third terminal connected to a reference potential. The resistive element is connected to the switching element in series. The second polarity is opposite to the first polarity. the second direction is opposite to the first direction.

In other features, the resistive random access memory cell has a third terminal connected to a reference potential. The resistive element has (i) a first terminal and (ii) a second terminal. The first terminal of the resistive element is connected to the first terminal of the resistive random access memory cell. The switching element has (i) a first terminal, (ii) a second terminal, and (iii) a control terminal. The first terminal of the switching element is connected to the second terminal of the resistive element. The second terminal of the switching element is connected to the third terminal of the resistive random access memory cell. The control terminal of the switching element is connected to the second terminal of the resistive random access memory cell.

In other features, the resistive random access memory cell has a third terminal connected to a reference potential. The first terminal of the resistive element is connected to the third terminal of the resistive random access memory cell. The switching element has (i) a first terminal, (ii) a second terminal, and (iii) a control terminal. The first terminal of the switching element is connected to the second terminal of the resistive element. The second terminal of the switching element is connected to the first terminal of the resistive random access memory cell. The control terminal of the switching element is connected to the second terminal of the resistive random access memory cell.

In other features, the switching element includes a metal-oxide semiconductor field-effect transistor, and a substrate of the metal-oxide semiconductor field-effect transistor is connected to a reference potential of the resistive random access memory cell.

In other features, the switching element includes a metal-oxide semiconductor field-effect transistor, and the method further comprises charging a substrate of the metal-oxide semiconductor field-effect transistor to a third voltage of the second polarity in response to driver circuit applying the voltage of the second polarity to the bit line. The third voltage prevents a PN junction between (i) the substrate and (ii) the first terminal or the second terminal of the metal-oxide semiconductor field-effect transistor from being forward biased in response to driver circuit applying the voltage of the second polarity to the bit line.

In still other features, a method comprises arranging a first resistive random access memory cell along a first bit line, and arranging a second resistive random access memory cell along a second bit line. The first resistive random access memory cell includes (i) a first resistive element and (ii) a first switching element. The first resistive random access memory cell has (i) a first terminal, (ii) a second terminal, and (iii) a third terminal. The first terminal is connected to a first bit line. The second terminal is connected to a first word line. The third terminal is connected to a second word line. The second resistive random access memory cell includes (i) a second resistive element and (ii) a second switching element. The second resistive random access memory cell has (i) a first terminal, (ii) a second terminal, and (iii) a third terminal. The first terminal of the second resistive random access memory cell is connected to a second bit line. The second terminal of the second resistive random access memory cell is connected to the first word line. The third terminal of the second resistive random access memory cell is connected to the second word line. The method further comprises applying voltages to (i) the first word line, (ii) the second word line, (iii) the first bit line, and (iv) the second bit line. The method further comprises programming the first resistive random access memory cell to a first state by causing current to flow through the first resistive element in a first direction. The method further comprises programming the second resistive random access memory cell to a second state by causing current to flow through the second resistive element in a second direction.

In other features, the method further comprises applying a supply voltage to (i) the first word line and (ii) the first bit line; applying one-half of the supply voltage to the second word line; and applying a reference potential to the second bit line.

In other features, the method further comprises applying a supply voltage to the first word line; (i) applying a reference potential to the second word line, (ii) apply the supply voltage to the first bit line, and (iii) applying the reference potential to the second bit line or float the second bit line; and (i) applying the supply voltage to the second word line, (ii) apply the supply voltage to the first bit line or float the first bit line, and (iii) applying the reference potential to the second bit line.

In other features, the first resistive element has (i) a first terminal and (ii) a second terminal. The first terminal of the first resistive element is connected to the first terminal of the first resistive random access memory cell. The first switching element has (i) a first terminal, (ii) a second terminal, and (iii) a control terminal. The first terminal of the first switching element is connected to the second terminal of the first resistive element. The second terminal of the first switching element is connected to the third terminal of the first resistive random access memory cell. The control terminal of the first switching element is connected to the second terminal of the first resistive random access memory cell.

In other features, the second resistive element has (i) a first terminal and (ii) a second terminal. The first terminal of the second resistive element is connected to the first terminal of the second resistive random access memory cell. The second switching element has (i) a first terminal, (ii) a second terminal, and (iii) a control terminal. The first terminal of the second switching element is connected to the second terminal of the second resistive element. The second terminal of the second switching element is connected to the third terminal of the second resistive random access memory cell. The control terminal of the second switching element is connected to the second terminal of the second resistive random access memory cell.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1C:
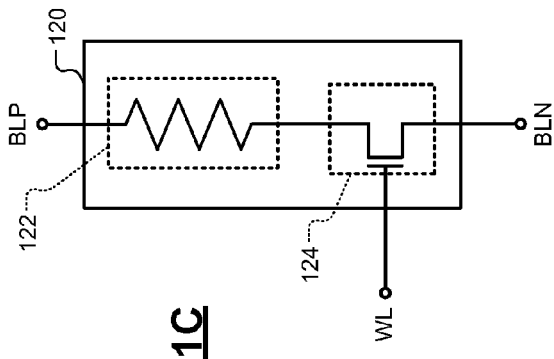
FIG. 1C is a schematic of a RRAM cell.
Figure 1A:
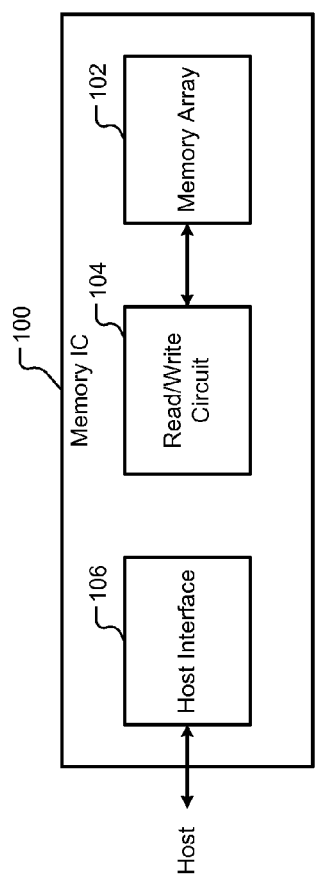
FIG. 1A is a functional block diagram of a memory integrated circuit (IC) comprising resistive random access memory (RRAM) cells.

FIG. 1A shows a memory integrated circuit (IC) 100. The memory IC 100 includes a memory array 102, a read/write circuit 104, and a host interface 106. The memory array 102 includes a plurality of resistive random access memory (RRAM) cells (hereinafter resistive memory cells). The memory array 102 includes a plurality of word lines and a plurality of bit lines. The bit lines may be perpendicular to the word lines. The resistive memory cells are arranged at intersections of the word lines and bit lines. The read/write circuit 104 reads data from and writes data to the resistive memory cells. The host interface 106 interfaces the memory IC 100 to a host.

The host interface 106 receives read/write commands from the host and outputs the read/write commands to the read/write circuit 104. In response to a read command, the read/write circuit 104 reads data from the resistive memory cells in the memory array 102 and outputs the read data to the host interface 106. The host interface 106 forwards the read data to the host. In response to a write command, the read/write circuit 104 writes data to the resistive memory cells in the memory array 102.

Figure 1B:
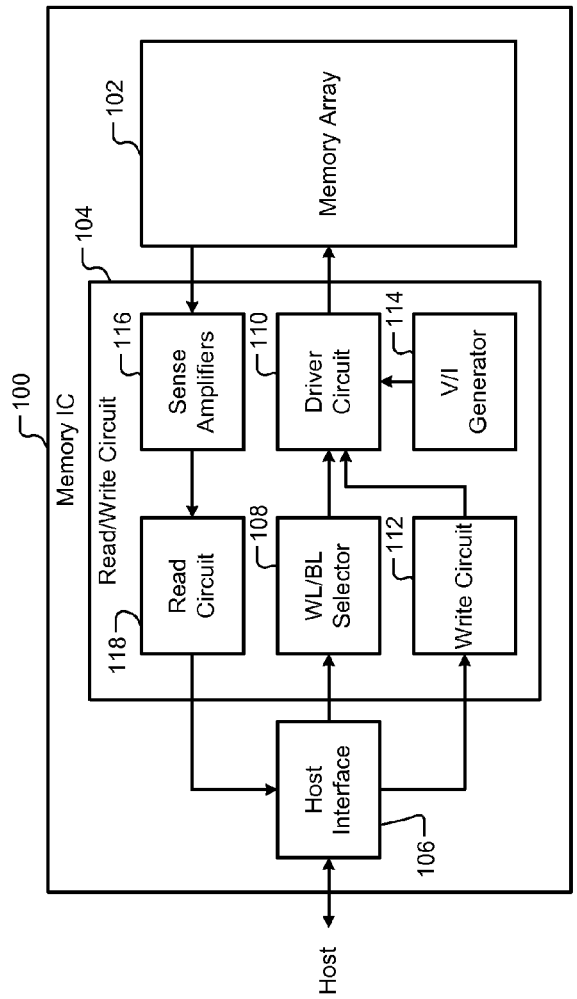
FIG. 1B is a detailed functional block diagram of the memory IC of FIG. 1A.

FIG. 1B shows the read/write circuit 104 of the memory IC 100 in further detail. The read/write circuit 104 includes a word line (WL)/bit line (BL) selector 108, a driver circuit 110, a write circuit 112, a voltage/current (V/I) generator 114, a plurality of sense amplifiers 116, and a read circuit 118. When the host interface 106 receives a write command, the host interface 106 outputs the address or addresses of memory cells in the memory array 102 where data needs to be written and outputs the data to be written in the memory cells to the write circuit 112. Based on the address or addresses of the memory cells, the WL/BL selector 108 selects appropriate word lines to select the memory cells for writing data. The driver circuit 110 receives the data from the write circuit 112. Based on the data, the driver circuit 110 selects one or more voltages (and/or currents) generated by the V/I generator 114 and applies the one or more voltages (and/or currents) to the selected word lines and bit lines and writes the data to the selected memory cells.

When the host interface 106 receives read command, the host interface 106 outputs the address or addresses of memory cells in the memory array 102 from which data needs to read. Based on the address or addresses of the memory cells, the WL/BL selector 108 selects appropriate word lines to select the memory cells from which data is to be read. The driver circuit 110 selects one or more voltages (and/or currents) generated by the V/I generator 114 and applies the one or more voltages (and/or currents) to the selected word lines and bit lines. The sense amplifiers 116 sense voltages on the bits lines (or currents through the bits lines) and sense the states of (i.e., read data stored in) the selected memory cells. The read circuit 118 reads the data sensed by the sense amplifiers 116 and outputs the read data to the host interface 106.

FIG. 1C shows an example of a resistive memory cell 120 of the memory array 102. The resistive memory cell 120 shown is a bipolar resistive memory cell. The resistive memory cell 120 includes a resistive element 122 and a switching element 124. The resistive element 122 and the switching element 124 are connected in series. For example only, the switching element 124 includes a metal-oxide semiconductor field-effect transistor (MOSFET). A gate of the switching element 124 is connected to a word line. A first terminal of the resistive element 122 is connected to a positive bit line (BLP). A second terminal of the resistive element 122 is connected to a first terminal of the switching element 124 (e.g., a drain of the MOSFET). The second terminal of the switching element 124 (e.g., a source of the MOSFET) is connected to a negative bit line (BLN).

The resistive memory cell 120 is selected using the word line. The resistive memory cells 120 can be programmed to a first state (e.g., a high resistance state) or a second state (e.g., a low resistance state). For example, the resistive memory cell 120 can be programmed to the first state by passing current in a first direction through the resistive element 122 (e.g., from BLP to BLN), or to the second state by passing current in a second direction to the resistive element 122 (e.g., from BLN to BLP). Accordingly, in addition to the word line, both BLP and BLN are connected to the read/write circuit 104. The bulk of the MOSFET is normally connected to a reference potential (e.g., $V_{SS}$). Therefore, the resistive memory cell 120 is a 3-signal bipolar RRAM memory cell.

Figure 2B:
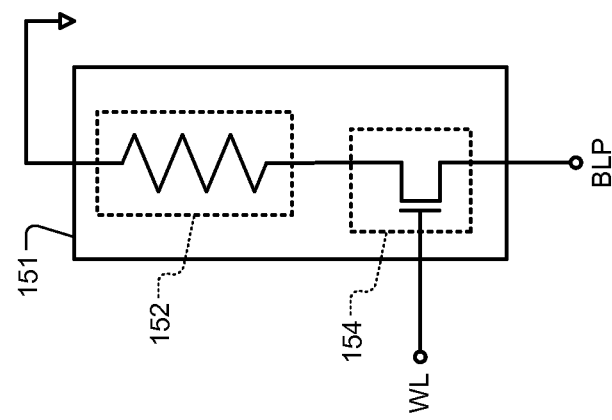
FIG. 2B is a schematic of a two-signal RRAM cell.
Figure 2A:
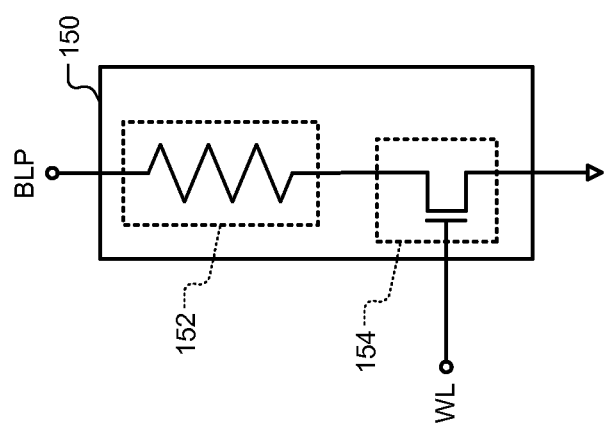
FIG. 2A is a schematic of a three-signal RRAM cell.

FIG. 2A shows a 2-signal bipolar RRAM memory cell 150 (hereinafter resistive memory cell 150) according to the present disclosure. The resistive memory cell 150 requires only two signals for write operations: WL and BLP (or BLN, if the MOSFET is a PMOSFET). The resistive memory cell 150 therefore has only two active terminals: WL and BLP. The resistive memory cell 150 does not require a third signal (i.e., BLN if the MOSFET is an NMOSFET as shown or BLP if the MOSFET is a PMOSFET) for write operations. Accordingly, the third terminal of the resistive memory cell 150 is connected to the reference potential (e.g., $V_{SS}$) and is common to all resistive memory cells in a memory array.

In the example shown in FIG. 2A, the resistive memory cell 150 includes a resistive element 152 and a switching element 154, which is an NMOSFET. To write to the resistive memory cell 150, the WL/BL selector 108 selects the word line connected to the gate of the resistive memory cell 150 (and to the gates of a plurality of resistive memory cells along the word line). To write a first state in the resistive memory cell 150, the driver circuit 110 applies a first voltage generated by the V/I generator 114 to the bit line BLP. The first voltage is positive relative to the reference potential $V_{SS}$. Accordingly, a first current flows in a first direction through the resistive element 152. The first direction is from the first terminal of the resistive memory cell 150 connected to the bit line BLP to the third terminal of the resistive memory cell 150 connected to the reference potential $V_{SS}$.

To write a second state in the resistive memory cell 150, the driver circuit 110 applies a second voltage generated by the V/I generator 114 to the bit line BLP. The second voltage is negative relative to the reference potential $V_{SS}$. Accordingly, a second current flows in a second direction through the resistive element 152. The second direction is from the third terminal of the resistive memory cell 150 connected to the reference potential $V_{SS}$ to the first terminal of the resistive memory cell 150 connected to the bit line BLP.

Since the bulk of the NMOSFET is normally connected to the reference potential $V_{SS}$, there is a limit to how negative the bit line BLP can be made before the parasitic PN junction between the P-type bulk and the N-type drain/source of the NMOSFET turns on and interferes with the write operation. If the write operation of a particular RRAM fabrication process requires a high-voltage that is sufficient to turn on the PN junction, the bulk of the NMOSFET can be made negative (or positive if PMOSFET is used) instead of connecting the bulk to the reference potential $V_{SS}$. For example, the V/I generator 114 can include a charge pump that pumps charge into the substrate of the NMOSFET to make the bulk of the NMOSFET negative (or positive if PMOSFET is used). In this manner, the resistive memory cell 150 can be programmed using a word line and only one of the two bit lines BLP or BLN depending on the type of MOSFET used as the switching element 154.

FIG. 2B shows a resistive memory cell 151 in which the connections of the bit line (e.g., BLP) and the reference potential $V_{SS}$ are reversed relative to the resistive memory cell 150 shown in FIG. 2A. All other description provided with reference to FIG. 2A applies equally to FIG. 2B and is therefore omitted to avoid repetition.

Figure 3:
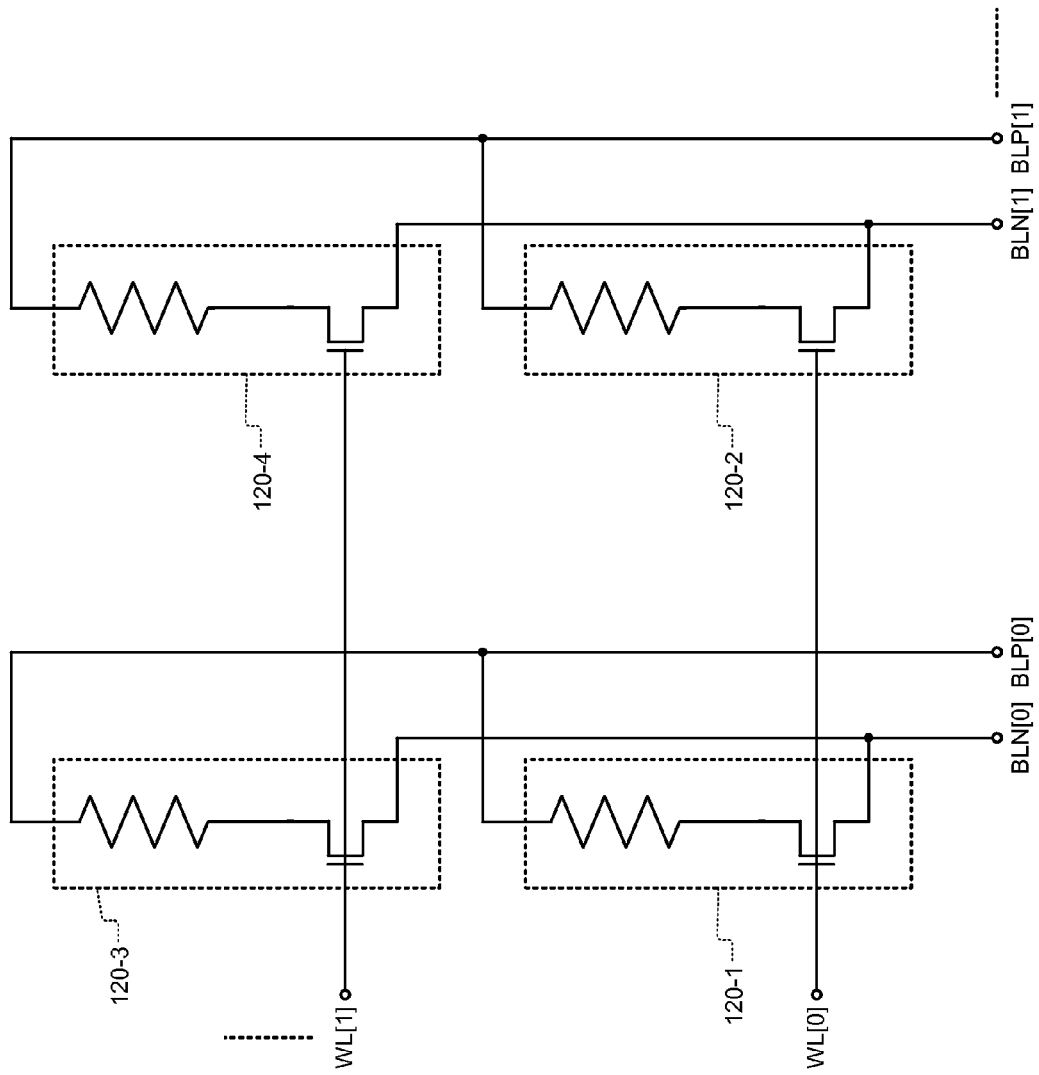
FIG. 3 is a 2×2 array of RRAM cells, where a word line represents a row of RRAM cells, and a bit line pair represents a column of RRAM cells.

FIG. 3 shows an example of a memory array including two rows and two columns of resistive memory cells arranged along two word lines and two pairs of bit lines. A pair of bit lines is used to write to a resistive memory cell along a word line. The word lines WL[1:0] represent the rows, and pairs of bit lines BLP/BLN represent the columns.

For example, resistive memory cells 120-1 and 120-2 are arranged along a word line WL0 (a first row) and bit line pairs [BLN0, BLP0] (a first column) and [BLN1, BLP1] (a second column). Resistive memory cells 120-3 and 120-4 are arranged along a word line WL1 (a second row) and the bit line pairs [BLN0, BLP0] (the first column) and [BLN1, BLP1] (the second column).

One or more resistive memory cells 120-n on a selected word line WLn can be programmed to different states using the bit line pairs connected to the one or more resistive memory cells 120-n. For example, along the word line WL0, the resistive memory cell 120-1 can be programmed to a first state and the resistive memory cell 120-2 can be programmed to a second state, where the second state is opposite to the first state, as follows. The word line WL0 is selected, and a supply voltage $V_{DD}$ is applied to the selected word line WL0. All other unselected word lines are set to the reference potential $V_{SS}$. Then the following voltages are applied to the bit lines connected to the resistive memory cells 120-1 and 120-2. BLN0=$V_{SS}$, BLP0=$V_{DD}$; and BLN1=$V_{DD}$, and BLP1=$V_{SS}$.

Since BLN0=$V_{SS}$ and BLP0=$V_{DD}$, current flows through the resistive memory cell 120-1 in a first direction (from BLP0 to BLN0), and the resistive memory cell 120-1 is programmed to the first state. Since BLN1=$V_{DD}$ and BLP1=$V_{SS}$, current flows through the resistive memory cell 120-2 in a second direction (from BLN1 to BLP1), where the second direction is opposite to the first direction, and the resistive memory cell 120-2 is programmed to the second state.

Figure 4:
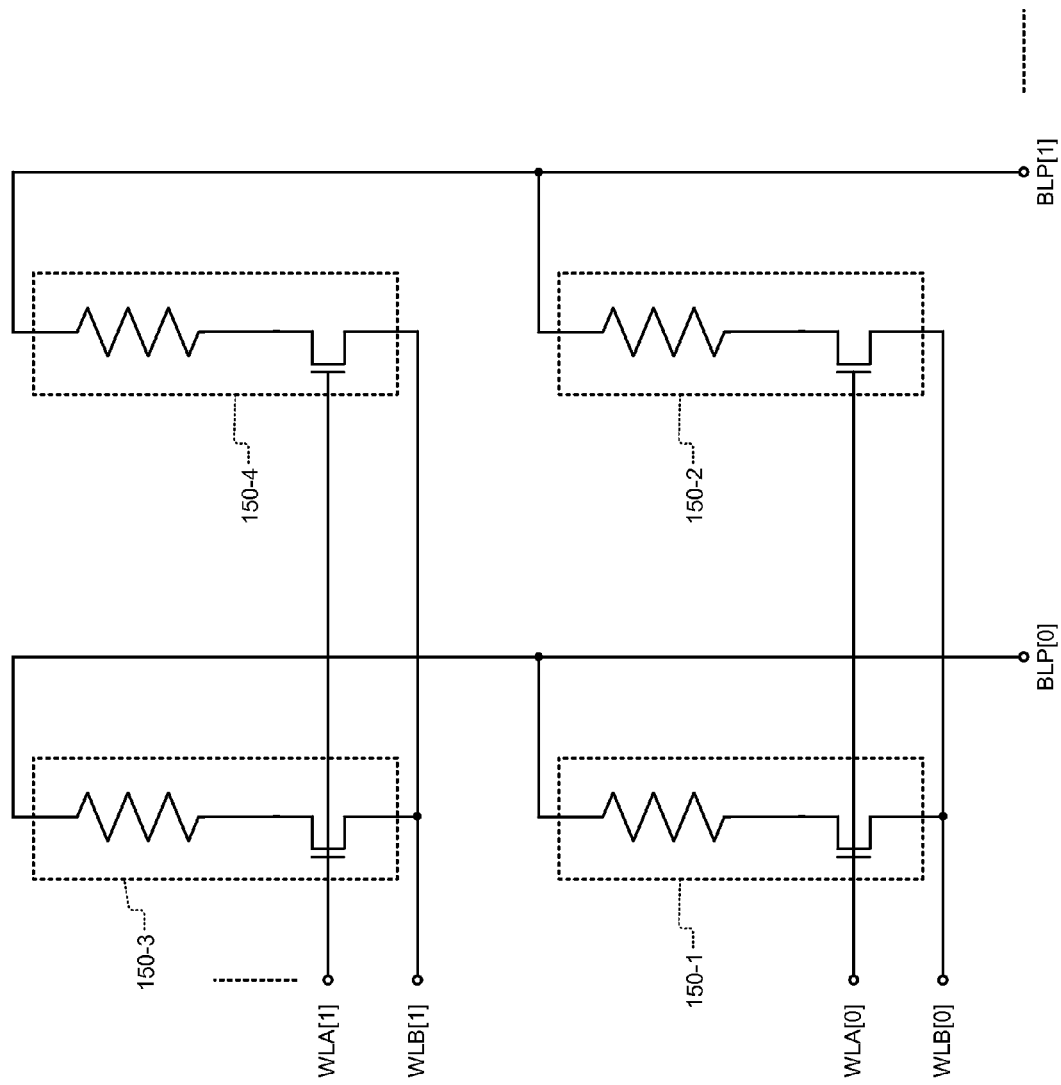
FIG. 4 is a 2×2 array of RRAM cells, where a word line pair represents a row of RRAM cells, and a single bit line represents a column of RRAM cells.

FIG. 4 shows an example of a memory array including two rows and two columns of resistive memory cells arranged along two pairs of word lines and two bit lines according to the present disclosure. A pair of word lines is used to write to a resistive memory cell along a row. A first pair of word lines

[WLA0, WLB0] represents a first row, and a second pair of word lines [WLA1, WLB1] represents a second row. A bit line BLP0 represents a first column, and a bit line BLP1 represents a second column.

For example, resistive memory cells 150-1 and 150-2 are arranged along the first pair of word lines [WLA0, WLB0] (the first row) and bit lines BLP0 and BLP1 (two columns), and resistive memory cells 150-3 and 150-4 are arranged along the second pair of word lines [WLA1, WLB1] (the second row) and the bit lines BLP0 and BLP1 (two columns).

One or more resistive memory cells 150-n on a selected pair of word lines can be programmed to different states using the bit lines connected to the one or more resistive memory cells 150-n. For example, the resistive memory cell 150-1 can be programmed to a first state and the resistive memory cell 150-2 can be programmed to a second state, where the second state is opposite to the first state, in one of two ways as follows.

In a first way, the WL/BL selector 108 selects the first pair of word lines [WLA0, WLB0]. The driver circuit 110 selects a supply voltage $V_{DD}$ generated by the V/I generator 114 and applies the supply voltage $V_{DD}$ to the word line WLA0 and a voltage $V_{DD}/2$ to the word line WLB0. All other unselected word line pairs are set to the reference potential $V_{SS}$. Then the following voltages are applied to the bit lines connected to the resistive memory cells 150-1 and 150-2: BLP0=$V_{DD}$ and BLP1=$V_{SS}$.

Since WLA0 and BLP0 are set to $V_{DD}$ and WLB0 is set to $V_{DD}/2$, current flows through the resistive memory cell 150-1 in a first direction (from BLP0 to WLB0), and the resistive memory cell 150-1 is programmed to the first state. Since BLP1=$V_{SS}$, current flows through the resistive memory cell 150-2 in a second direction (from WLA1 to BLP1), where the second direction is opposite to the first direction, and the resistive memory cell 150-2 is programmed to the second state.

In a second way, use of the voltage $V_{DD}/2$ can be avoided using a writing process as follows. The WL/BL selector 108 selects the word line WLA0. The driver circuit 110 selects a supply voltage $V_{DD}$ generated by the V/I generator 114 and applies the supply voltage $V_{DD}$ to the word line WLA0. The driver circuit 110 selects the following voltages generated by the V/I generator 114 and applies them to the word line WLB0 and the bit lines connected to the resistive memory cells 150-1 and 150-2 as follows. WLB0=$V_{SS}$, BLP0=$V_{DD}$, and BLP1=$V_{SS}$ or no connection (floating). The driver circuit 110 selects the following voltages generated by the V/I generator 114 and applies them to the word line WLB0 and the bit lines connected to the resistive memory cells 150-1 and 150-2 as follows. WLB0=$V_{DD}$, BLP0=$V_{DD}$ or no connection (floating), and BLP1=$V_{SS}$.

Since WLA0 is set to $V_{DD}$ and WLB0 is set to $V_{SS}$, since BLP0 is set to $V_{DD}$, and BLP1 is set to $V_{SS}$ or no connection (floating), current flows through the resistive memory cell 150-1 in a first direction (from BLP0 to WLB0), and the resistive memory cell 150-1 is programmed to the first state. Since BLP1 is set to VSS or no connection (floating), no current path exists for current to flow through the resistive memory cell 150-2.

Since WLA0 and WLB0 are set to $V_{DD}$, BLP0 is set to $V_{DD}$ or no connection (floating), and BLP1 is set to $V_{SS}$, current flows through the resistive memory cell 150-2 in a second direction (from WLA0 to BLP1), where the second direction is opposite to the first direction, and the resistive memory cell 150-2 is programmed to the second state. Since WLA0 and WLB0 are set to $V_{DD}$ and BLP0 is set to $V_{DD}$ or no connection (floating), no current path exists for current to flow through the resistive memory cell 150-1.

Figure 5:
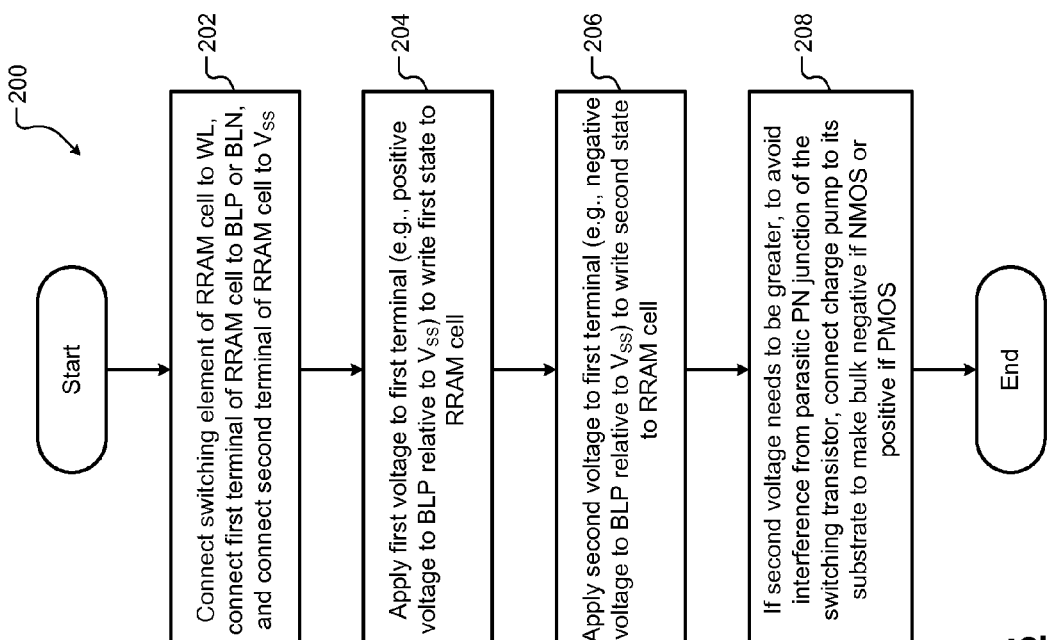
FIG. 5 is a flowchart of a method for configuring a two-signal RRAM cell and writing to the two-signal RRAM cell.

FIG. 5 shows a method 200 for configuring a resistive memory cell for write operations according to the present disclosure. At 202, a switching element of the resistive memory cell is connected to a word line, a first terminal of the resistive memory cell is connected to a bit line BLP or BLN depending on whether the switching element of the resistive memory cell includes an NMOSFET or a PMOSFET, and a second terminal of the resistive memory cell is connected to a reference potential $V_{SS}$. At 204, control applies a first voltage to the first terminal (e.g., a positive voltage to the bit line BLP relative to the reference voltage $V_{SS}$ if the switching element is an NMOSFET) to write a first state into the resistive memory cell. At 206, control applies a second voltage to the first terminal (e.g., a negative voltage to the bit line BLP relative to the reference voltage $V_{SS}$ if the switching element is an NMOSFET) to write a second state into the resistive memory cell, where the second state is opposite of the first state. At 208, if the second voltage needs to be higher, to avoid interference from the parasitic PN junction of the switching transistor, control pumps charge into a substrate of the switching transistor to make the bulk negative or positive depending on whether the switching element includes an NMOSFET or a PMOSFET.

Figure 6:
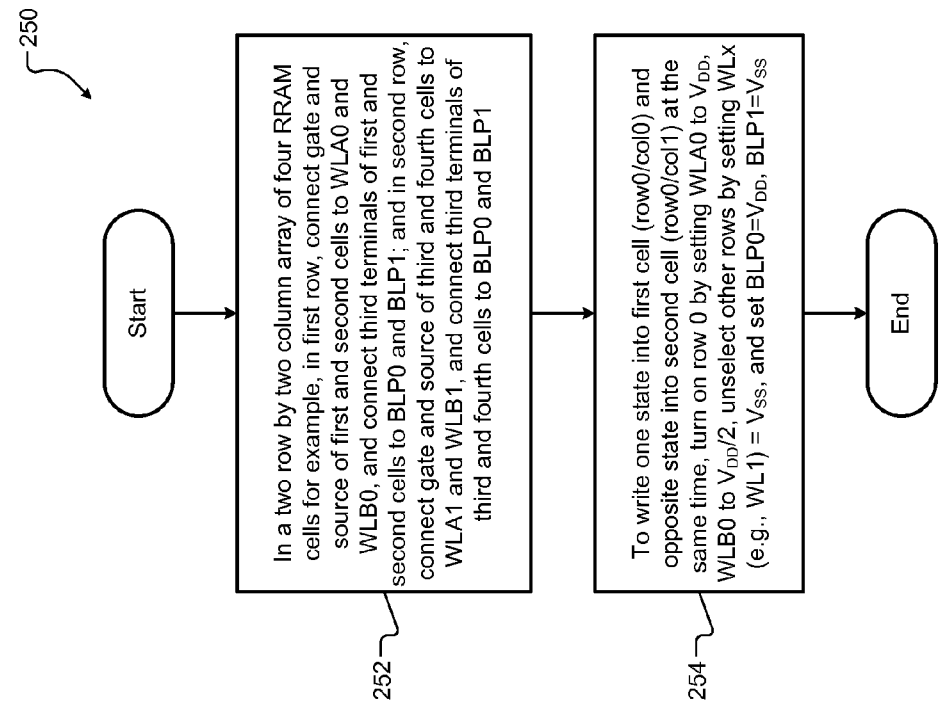
FIG. 6 is a flowchart of a method for writing to RRAM cells, where each RRAM cell connects to a pair of word lines and a single bit line, and where a supply voltage $V_{DD}$ is applied to a first word line, and a voltage $V_{DD}/2$ is applied to a second word line.

FIG. 6 shows a method 250 for configuring rows and columns of resistive memory cells for write operations according to the present disclosure. At 252, in a 2×2 array of four resistive memory cells for example, in a first row, gate and source terminals of switching transistors (i.e., first and second terminals) of first and second resistive memory cells are connected to word lies WLA0 and WLB0. Third terminals of the first and second resistive memory cells are connected to the bit lines BLP0 and BLP1, respectively. In a second row, gate and source terminals of switching transistors (i.e., first and second terminals) of third and fourth resistive memory cells are connected to word lies WLA1 and WLB1. Third terminals of the third and fourth resistive memory cells are connected to the bit lines BLP0 and BLP1, respectively.

At 254, to write one state into the first cell located at row0/column0 and an opposite state into the second cell located at row0/column1 at the same time, control turns on row0 by applying the supply voltage $V_{DD}$ to the word line WLA0 and $V_{DD}/2$ to the word line WLB0. Control deselects all other rows by setting word lines of the other rows to the reference voltage VSS. Control applies the supply voltage $V_{DD}$ to the bit line BLP0 and the reference voltage $V_{SS}$ to the bit line BLP1. Accordingly, current flows in one direction through the first resistive memory cell to write a first state in the first resistive memory cell, and current flows in an opposite direction through the second resistive memory cell to write a second state that is opposite of the first state into the second resistive memory cell.

Figure 7:
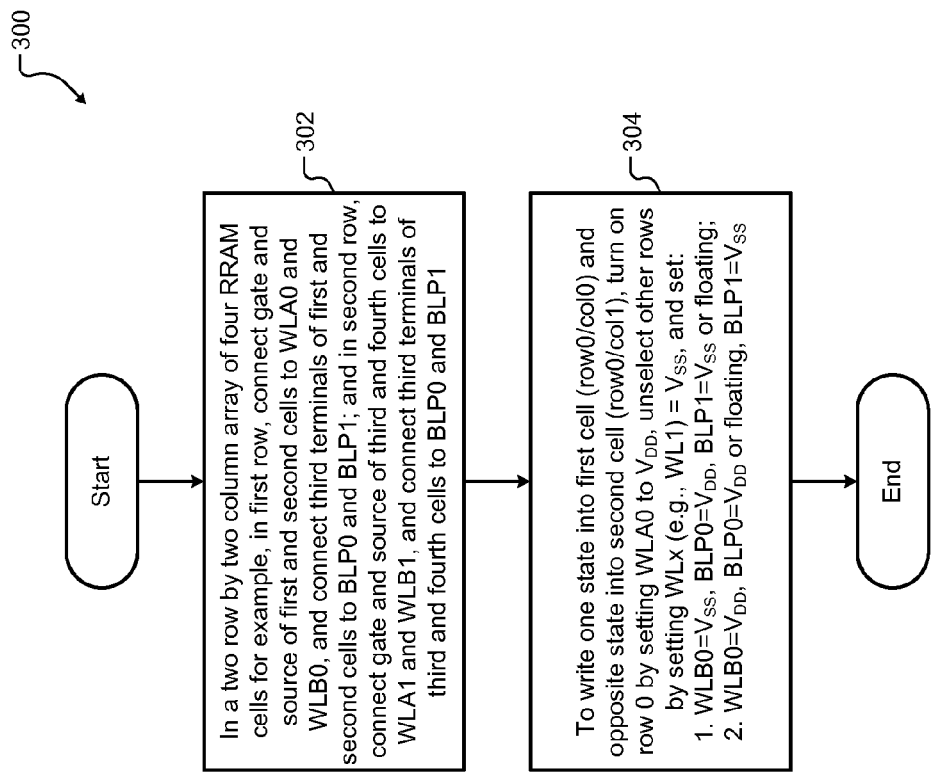
FIG. 7 is a flowchart of a method for writing to RRAM cells, where each RRAM cell connects to a pair of word lines and a single bit line, and where a two-step writing process is used instead using a voltage $V_{DD}/2$.

FIG. 7 shows a method 300 for configuring rows and columns of resistive memory cells for write operations according to the present disclosure. At 302, in a 2×2 array of four resistive memory cells for example, in a first row, gate and source terminals of switching transistors (i.e., first and second terminals) of first and second resistive memory cells are connected to word lines WLA0 and WLB0. Third terminals of the first and second resistive memory cells are connected to the bit lines BLP0 and BLP1, respectively. In a second row, gate and source terminals of switching transistors (i.e., first and second terminals) of third and fourth resistive memory cells are connected to word lies WLA1 and WLB1. Third terminals of the third and fourth resistive memory cells are connected to the bit lines BLP0 and BLP1, respectively.

At 304, to write one state into the first cell located at row0/column0 and an opposite state into the second cell located at row0/column1, control turns on row0 by applying the supply voltage $V_{DD}$ to the word line WLA0. Control deselects all other rows by setting word lines of the other rows to the reference voltage $V_{SS}$. Control applies the reference voltage $V_{SS}$ to the word line WLB0, the supply voltage $V_{DD}$ to the bit line BLP0, and the reference voltage $V_{SS}$ to the bit line BLP1 (or floats the bit line BLP1). Control applies the supply voltage $V_{DD}$ to the word line WLB0, the supply voltage $V_{DD}$ to the bit line BLP0 (or floats the bit line BLP0), and the reference voltage $V_{SS}$ to the bit line BLP1. Accordingly, current flows in one direction through the first resistive memory cell to write a first state in the first resistive memory cell, and current flows in an opposite direction through the second resistive memory cell to write a second state that is opposite of the first state into the second resistive memory cell.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A system comprising:
   a resistive random access memory cell including
       a resistive element, and
       a switching element,
           wherein the switching element includes a metal-oxide semiconductor field-effect transistor, wherein a substrate of the metal-oxide semiconductor field-effect transistor is connected to a reference potential of the resistive random access memory cell,
       wherein the resistive random access memory cell has (i) a first terminal (ii) a second terminal, and (iii) a second terminal,
       wherein the first terminal is connected to a bit line, and
       wherein the second terminal is connected to a word line; and
       wherein the third terminal is connected to a reference potential; and
   a driver circuit configured to apply, in response to selection of the resistive random access memory cell using the word line,
       a first voltage of a first polarity to the bit line to program the resistive random access memory cell to a first state by causing current to flow through the resistive element in a first direction, and
       a second voltage of a second polarity to the bit line to program the resistive random access memory cell to a second state by causing current to flow through the resistive element in a second direction.

2. The system of claim 1, wherein the second polarity is opposite to the first polarity, and wherein the second direction is opposite to the first direction.

3. The system of claim 1, wherein the resistive element is connected to the switching element in series.

4. The system of claim 1, wherein:
   the resistive random access memory cell has a third terminal connected to the reference potential;
   the resistive element has (i) a first terminal and (ii) a second terminal, and wherein the first terminal of the resistive element is connected to the first terminal of the resistive random access memory cell; and
   the switching element has (i) a first terminal, (ii) a second terminal, and (iii) a control terminal, wherein the first terminal of the switching element is connected to the second terminal of the resistive element, wherein the second terminal of the switching element is connected to the third terminal of the resistive random access memory cell, and wherein the control terminal of the switching element is connected to the second terminal of the resistive random access memory cell.

5. The system of claim 1, wherein:
   the resistive random access memory cell has a third terminal connected to the reference potential;
   the resistive element has (i) a first terminal and (ii) a second terminal, and wherein the first terminal of the resistive element is connected to the third terminal of the resistive random access memory cell; and
   the switching element has (i) a first terminal, (ii) a second terminal, and (iii) a control terminal, wherein the first terminal of the switching element is connected to the second terminal of the resistive element, wherein the second terminal of the switching element is connected to the first terminal of the resistive random access memory cell, and wherein the control terminal of the switching element is connected to the second terminal of the resistive random access memory cell.

6. A system comprising:
   a resistive random access memory cell including
       a resistive element, and
       a switching element,
           wherein the switching element includes a metal-oxide semiconductor field-effect transistor,
       wherein the resistive random access memory cell has (i) a first terminal and (ii) a second terminal,
       wherein the first terminal is connected to a bit line, and
       wherein the second terminal is connected to a word line;
   a driver circuit configured to apply, in response to selection of the resistive random access memory cell using the word line,
       a first voltage of a first polarity to the bit line to program the resistive random access memory cell to a first state by causing current to flow through the resistive element in a first direction, and
       a second voltage of a second polarity to the bit line to program the resistive random access memory cell to a second state by causing current to flow through the resistive element in a second direction; and
   a charge pump configured to charge a substrate of the metal-oxide semiconductor field-effect transistor to a third voltage of the second polarity in response to driver circuit applying the voltage of the second polarity to the bit line,
   wherein the third voltage prevents a PN junction between (i) the substrate and (ii) the first terminal or the second terminal of the metal-oxide semiconductor field-effect transistor from being forward biased in response to driver circuit applying the voltage of the second polarity to the bit line.

7. The system of claim 6, wherein the resistive random access memory cell has a third terminal, and wherein the third terminal is connected to a reference potential.

8. The system of claim 6, wherein the second polarity is opposite to the first polarity, and wherein the second direction is opposite to the first direction.

9. The system of claim 6, wherein the resistive element is connected to the switching element in series.

10. The system of claim 6, wherein:
the resistive random access memory cell has a third terminal connected to a reference potential;
the resistive element has (i) a first terminal and (ii) a second terminal, and wherein the first terminal of the resistive element is connected to the first terminal of the resistive random access memory cell; and
the switching element has (i) a first terminal, (ii) a second terminal, and (iii) a control terminal, wherein the first terminal of the switching element is connected to the second terminal of the resistive element, wherein the second terminal of the switching element is connected to the third terminal of the resistive random access memory cell, and wherein the control terminal of the switching element is connected to the second terminal of the resistive random access memory cell.

11. The system of claim 6, wherein:
the resistive random access memory cell has a third terminal connected to a reference potential;
the resistive element has (i) a first terminal and (ii) a second terminal, and wherein the first terminal of the resistive element is connected to the third terminal of the resistive random access memory cell; and
the switching element has (i) a first terminal, (ii) a second terminal, and (iii) a control terminal, wherein the first terminal of the switching element is connected to the second terminal of the resistive element, wherein the second terminal of the switching element is connected to the first terminal of the resistive random access memory cell, and wherein the control terminal of the switching element is connected to the second terminal of the resistive random access memory cell.

12. A system comprising:
a first resistive random access memory cell arranged along a first bit line, wherein the first resistive random access memory cell includes (i) a first resistive element and (ii) a first switching element, wherein the first resistive random access memory cell has (i) a first terminal, (ii) a second terminal, and (iii) a third terminal, wherein the first terminal is connected to the first bit line, wherein the second terminal is connected to a first word line, and wherein the third terminal is connected to a second word line;
a second resistive random access memory cell arranged along a second bit line, wherein the second resistive random access memory cell includes (i) a second resistive element and (ii) a second switching element, wherein the second resistive random access memory cell has (i) a first terminal, (ii) a second terminal, and (iii) a third terminal, wherein the first terminal of the second resistive random access memory cell is connected to the second bit line, wherein the second terminal of the second resistive random access memory cell is connected to the first word line, and wherein the third terminal of the second resistive random access memory cell is connected to the second word line; and
a driver circuit configured to
apply voltages to (i) the first word line, (ii) the second word line, (iii) the first bit line, and (iv) the second bit line;
program the first resistive random access memory cell to a first state by causing current to flow through the first resistive element in a first direction; and
program the second resistive random access memory cell to a second state by causing current to flow through the second resistive element in a second direction.

13. The system of claim 12, wherein the driver circuit is configured to:
apply a supply voltage to (i) the first word line and (ii) the first bit line,
apply one-half of the supply voltage to the second word line, and
apply a reference potential to the second bit line.

14. The system of claim 12, wherein the driver circuit is configured to:
apply a supply voltage to the first word line;
(i) apply a reference potential to the second word line, (ii) apply the supply voltage to the first bit line, and (iii) apply the reference potential to the second bit line or float the second bit line; and
(i) apply the supply voltage to the second word line, (ii) apply the supply voltage to the first bit line or float the first bit line, and (iii) apply the reference potential to the second bit line.

15. The system of claim 12, wherein:
the first resistive element has (i) a first terminal and (ii) a second terminal, and wherein the first terminal of the first resistive element is connected to the first terminal of the first resistive random access memory cell; and
the first switching element has (i) a first terminal, (ii) a second terminal, and (iii) a control terminal, wherein the first terminal of the first switching element is connected to the second terminal of the first resistive element, wherein the second terminal of the first switching element is connected to the third terminal of the first resistive random access memory cell, and wherein the control terminal of the first switching element is connected to the second terminal of the first resistive random access memory cell.

16. The system of claim 12, wherein:
the second resistive element has (i) a first terminal and (ii) a second terminal, and wherein the first terminal of the second resistive element is connected to the first terminal of the second resistive random access memory cell; and
the second switching element has (i) a first terminal, (ii) a second terminal, and (iii) a control terminal, wherein the first terminal of the second switching element is connected to the second terminal of the second resistive element, wherein the second terminal of the second switching element is connected to the third terminal of the second resistive random access memory cell, and wherein the control terminal of the second switching element is connected to the second terminal of the second resistive random access memory cell.

17. A method comprising:
selecting, using a word line, a resistive random access memory cell, wherein the resistive random access memory cell includes (i) a resistive element and (ii) a switching element, wherein the switching element includes a metal-oxide semiconductor field-effect transistor, wherein a substrate of the metal-oxide semiconductor field-effect transistor is connected to a reference potential of the resistive random access memory cell, wherein the resistive random access memory cell has (i) a first terminal, (ii) a second terminal and a third terminal, wherein the first terminal is connected to a bit line, wherein the second terminal is connected to the word line and wherein the third terminal is connected to the reference potential; and applying, in response to selection of the resistive random access memory cell using the word line, a first voltage of a first polarity to the bit line to program the resistive random access memory cell to a first state by causing current to flow through the resistive element in a first direction, and a second voltage of a second polarity to the bit line to program the resistive random access memory cell to a second state by causing current to flow through the resistive element in a second direction.

18. The method of claim 17, wherein the resistive random access memory cell has a third terminal connected to the reference potential, and wherein the resistive element is connected to the switching element in series.

19. The method of claim 17, wherein the second polarity is opposite to the first polarity, and wherein the second direction is opposite to the first direction.

20. The method of claim 17, wherein:
the resistive random access memory cell has a third terminal connected to the reference potential;
the resistive element has (i) a first terminal and (ii) a second terminal;
the first terminal of the resistive element is connected to the first terminal of the resistive random access memory cell;
the switching element has (i) a first terminal, (ii) a second terminal, and (iii) a control terminal;
the first terminal of the switching element is connected to the second terminal of the resistive element;
the second terminal of the switching element is connected to the third terminal of the resistive random access memory cell; and
the control terminal of the switching element is connected to the second terminal of the resistive random access memory cell.

21. The method of claim 17, wherein:
the resistive random access memory cell has a third terminal connected to the reference potential;
the resistive element has (i) a first terminal and (ii) a second terminal;
the first terminal of the resistive element is connected to the third terminal of the resistive random access memory cell;
the switching element has (i) a first terminal, (ii) a second terminal, and (iii) a control terminal;
the first terminal of the switching element is connected to the second terminal of the resistive element;
the second terminal of the switching element is connected to the first terminal of the resistive random access memory cell; and
the control terminal of the switching element is connected to the second terminal of the resistive random access memory cell.

22. A method comprising:
selecting, using a word line, a resistive random access memory cell, wherein the resistive random access memory cell includes (i) a resistive element and (ii) a switching element, wherein the switching element includes a metal-oxide semiconductor field-effect transistor, wherein the resistive random access memory cell has (i) a first terminal and (ii) a second terminal, wherein the first terminal is connected to a bit line, and wherein the second terminal is connected to the word line;

applying, in response to selection of the resistive random access memory cell using the word line, a first voltage of a first polarity to the bit line to program the resistive random access memory cell to a first state by causing current to flow through the resistive element in a first direction, and a second voltage of a second polarity to the bit line to program the resistive random access memory cell to a second state by causing current to flow through the resistive element in a second direction; and charging a substrate of the metal-oxide semiconductor field-effect transistor to a third voltage of the second polarity in response to driver circuit applying the voltage of the second polarity to the bit line, wherein the third voltage prevents a PN junction between (i) the substrate and (ii) the first terminal or the second terminal of the metal-oxide semiconductor field-effect transistor from being forward biased in response to driver circuit applying the voltage of the second polarity to the bit line.

* * * * *